United States Patent
Lee et al.

(10) Patent No.: US 10,573,951 B2
(45) Date of Patent: Feb. 25, 2020

(54) SPLIT RESONATOR AND PRINTED CIRCUIT BOARD INCLUDING THE SAME

(71) Applicant: Samsung Electronics Co., Ltd., Gyeonggi-do (KR)

(72) Inventors: Soon Yong Lee, Gyeonggi-do (KR); Yeon Sik Yu, Gyeonggi-do (KR); Il Kim, Gyeonggi-do (KR); Keon Young Seo, Seoul (KR); Min-Goo Seo, Gyeonggi-do (KR); Jae-Deok Lim, Gyeonggi-do (KR); Si Ho Jang, Gyeonggi-do (KR); Hyun-Tae Jang, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/603,582

(22) Filed: May 24, 2017

(65) Prior Publication Data
US 2018/0048047 A1 Feb. 15, 2018

(30) Foreign Application Priority Data
Aug. 11, 2016 (KR) .......................... 10-2016-0102364

(51) Int. Cl.
*H01P 7/08* (2006.01)
*H05K 1/02* (2006.01)
(Continued)

(52) U.S. Cl.
CPC ........... *H01P 7/082* (2013.01); *H05K 1/0227* (2013.01); *H05K 1/0353* (2013.01); *H05K 1/115* (2013.01);
(Continued)

(58) Field of Classification Search
CPC ..... H01P 7/082; H01P 1/2005; H05K 1/0219; H05K 1/0227; H05K 1/0353; H05K 1/115;
(Continued)

(56) References Cited

U.S. PATENT DOCUMENTS

2010/0182105 A1* 7/2010 Hein ....................... H01P 3/003
333/239

FOREIGN PATENT DOCUMENTS

KR 10-1008974 B1 1/2011
KR 10-2012-0075121 A 7/2012
(Continued)

OTHER PUBLICATIONS

Besser et al., Practical RF Circuit Design for Modern Wireless Systems, vol. 1, Artech House, 2003, pp. 372-374.*

*Primary Examiner* — Benny T Lee
*Assistant Examiner* — Hafizur Rahman
(74) *Attorney, Agent, or Firm* — Cha & Reiter, LLC.

(57) ABSTRACT

A split resonator and a printed circuit board (PCB) including the same are disclosed. The split resonator is mounted to one side of the PCB to improve the electromagnetic shielding effect, and absorbs a radiation field emitted to the outer wall of the PCB. The PCB includes: a substrate on which one or more electronic components are populated; a dielectric substrate mounted to one side of the substrate; one pair of conductors provided in the dielectric substrate, spaced apart from the substrate in a thickness direction of the substrate by a predetermined distance, and arranged to face each other; and a connection portion configured to interconnect the one pair of conductors, and arranged in parallel to the thickness direction of the substrate.

19 Claims, 20 Drawing Sheets

(51) Int. Cl.
 *H05K 1/03* (2006.01)
 *H05K 1/11* (2006.01)
(52) U.S. Cl.
 CPC .............. *H05K 2201/09218* (2013.01); *H05K 2201/09618* (2013.01)
(58) Field of Classification Search
 CPC ....... H05K 1/0236; H05K 2201/09218; H05K 2201/09618; H05K 2201/09781
 USPC ......................................................... 333/219
 See application file for complete search history.

(56) References Cited

FOREIGN PATENT DOCUMENTS

| | | |
|---|---|---|
| KR | 10-2013-0076130 A | 7/2013 |
| KR | 10-1567260 B1 | 11/2015 |
| KR | 10-2015-0139050 A | 12/2015 |

\* cited by examiner (a)

(b)

SPLIT RESONATOR AND PRINTED CIRCUIT BOARD INCLUDING THE SAME

CLAIM OF PRIORITY

This application claims the benefit of Korean Patent Application No. 10-2016-0102364, filed on Aug. 11, 2016 in the Korean Intellectual Property Office, the disclosure of which is incorporated herein by reference.

BACKGROUND

1. Field

Embodiments of the present disclosure relate to a split resonator for absorbing electromagnetic waves generated from a printed circuit board (PCB), and the printed circuit board (PCB) including the same.

2. Description of the Related Art

A printed circuit board (PCB) is formed of one or more conductors capable of transmitting electrical signals to an insulation substrate. If electronic components are printed onto the PCB, the PCB may operate as an electric circuit. The PCBs, which are likened to nerves in the human body, are key components used for all electronic devices ranging from small appliances to advanced mobile communication devices.

With the increasing development of smaller-sized and higher-performance electronic devices having PCBs, electronic devices produce high-frequency electromagnetic waves, and high-frequency electromagnetic waves cause electronic noise or electronic interference problems. High frequencies generated from electronic devices cause mutual interference between devices, resulting in a malfunction between devices, and various adverse effects on the human body. Electromagnetic waves emitted or conducted from electronic devices, which may interfere with functions of other devices, are referred to as electromagnetic interference (EMI).

In order to solve EMI problems, technology for controlling radio waves under limited conditions is urgently needed, and studies and researches are actively underway to reduce EMI.

Electromagnetic damping is performed by various mechanisms, for example, reflection loss caused by impedance mismatch between the air space and a metal material, transmission loss causing heat dissipation due to loss of resistance after passing through a metal shielding layer, and multi-reflection loss caused by reflection ranging from boundary layers located at both sides of the metal shielding layer to the inside of a metal layer.

Electromagnetic shielding is classified into electric field shielding and magnetic field shielding. Electric field shielding is achieved by covering a target object with a superior-conductivity material, and the shielding effect may be changed according to thickness of the material. Generally, the shielding effect becomes better in proportion to the increasing thickness of the material. Magnetic field shielding may increase absorption loss using a high-permeability material or may reduce magnetic resistance of magnetic flux, thereby bypassing a magnetic field.

Even in a process for manufacturing printed circuit boards (PCBs) acting as key components of the electronic device, many developers and companies are conducting intensive research into electromagnetic shielding or the like. For example, a conductive paste formed by dissipating conductive powders onto a binder resin may be evenly applied onto the PCB, or a film-type conductive paste is formed, heated, and then attached to implement a conductive adhesion film, resulting in implementation of electromagnetic shielding.

As a representative example of developing and researching the above-mentioned electromagnetic shielding technology, a method for reducing radio frequency (RF) signals emitted from the outermost part of the PCB is needed, and as such a detailed description thereof is as follows.

SUMMARY

Therefore, it is an aspect of the present disclosure to provide a split resonator mounted to one side of a printed circuit board (PCB) so as to improve the electromagnetic shielding effect.

It is another aspect of the present disclosure to provide a split resonator for absorbing a radiation field emitted to an outer wall of the PCB.

Additional aspects of the invention will be set forth in part in the description which follows and, in part, will be obvious from the description, or may be learned by practice of the invention.

In accordance with one aspect of the present disclosure, a printed circuit board (PCB) may include a substrate on which one or more electronic components are populated; a dielectric substrate mounted to one side of the substrate; one pair of conductors provided in the dielectric substrate, spaced apart from the substrate in a thickness direction of the substrate by a predetermined distance, and arranged to face each other; and a connection portion configured to interconnect the one pair of conductors, and arranged in parallel to the thickness direction of the substrate.

The connection portion may include a plurality of connection portions configured to interconnect the one pair of conductors.

The one pair of conductors may be arranged at a predetermined angle on the basis of the thickness direction of the substrate.

The one pair of conductors, the connection portion, and the dielectric substrate may be arranged to be symmetrical to each other on the basis of the substrate.

The dielectric substrate may include FR4.

The one pair of conductors may include a predetermined width on the basis of capacitance of a capacitor.

The connection portion may be formed in a cylindrical shape on the basis of inductance.

The conductor and the connection portion may be formed of metal.

In accordance with another aspect of the present disclosure, a printed circuit board (PCB) may include a substrate on which one or more electronic components are populated; a dielectric substrate mounted to one side of the substrate; and one or more split resonators provided in the dielectric substrate, and periodically arranged in the dielectric substrate, wherein the split resonator includes: one pair of conductors provided in the dielectric substrate, spaced apart from the substrate in a thickness direction of the substrate by a predetermined distance, and arranged to face each other; and a connection portion configured to interconnect the one pair of conductors, and arranged in parallel to the thickness direction of the substrate.

The connection portion may include a plurality of connection portions configured to interconnect the one pair of conductors.

The one pair of conductors may be arranged at a predetermined angle on the basis of the thickness direction of the substrate.

The split resonators may be symmetrical to each other on the basis of the substrate.

The dielectric substrate may include an FR4 epoxy substrate.

The one pair of conductors may include a predetermined width on the basis of capacitance of a capacitor.

The connection portion may be formed in a cylindrical shape on the basis of inductance.

The conductor and the connection portion are formed of metal.

The substrate may include: a first ground plane provided in the substrate; a signal line located below the first ground plane, and spaced apart from the first ground plane; and a second ground plane located below the signal line.

In accordance with the other aspect of the present disclosure, a split resonator may include one pair of conductors provided in the dielectric substrate, spaced apart from the substrate in a thickness direction of the substrate by a predetermined distance, and arranged to face each other; and a connection portion configured to interconnect the one pair of conductors, and arranged in parallel to the thickness direction of the substrate.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1A:
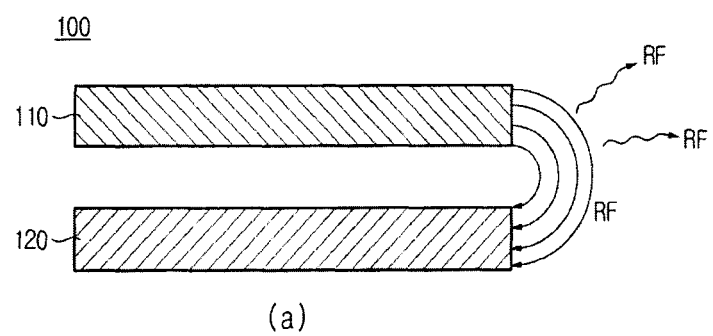
FIG. 1A and FIG. 1B are conceptual diagrams illustrating a conventional art related to the present disclosure.

Reference will now be made in detail to the embodiments of the present disclosure, examples of which are illustrated in the accompanying drawings, wherein like reference numerals refer to like elements throughout.

The terms used in the present application are merely used to describe specific embodiments and are not intended to limit the present disclosure.

For example, a singular expression may include a plural expression unless otherwise stated in the context.

In the present application, the terms "including" or "having" are used to indicate that features, numbers, steps, operations, components, parts or combinations thereof described in the present specification are present and presence or addition of one or more other features, numbers, steps, operations, components, parts or combinations is not excluded.

In description of the present disclosure, the terms "first" and "second" may be used to describe various components, but the components are not limited by the terms. The terms may be used to distinguish one component from another component.

Figure 1A:
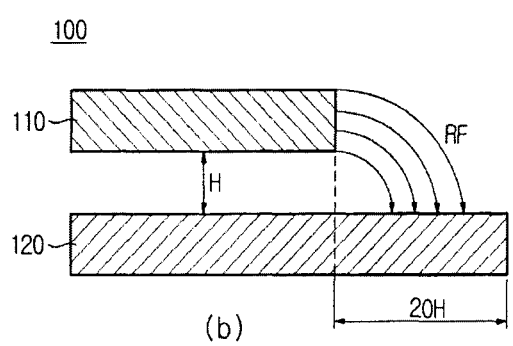
Figure 1B:
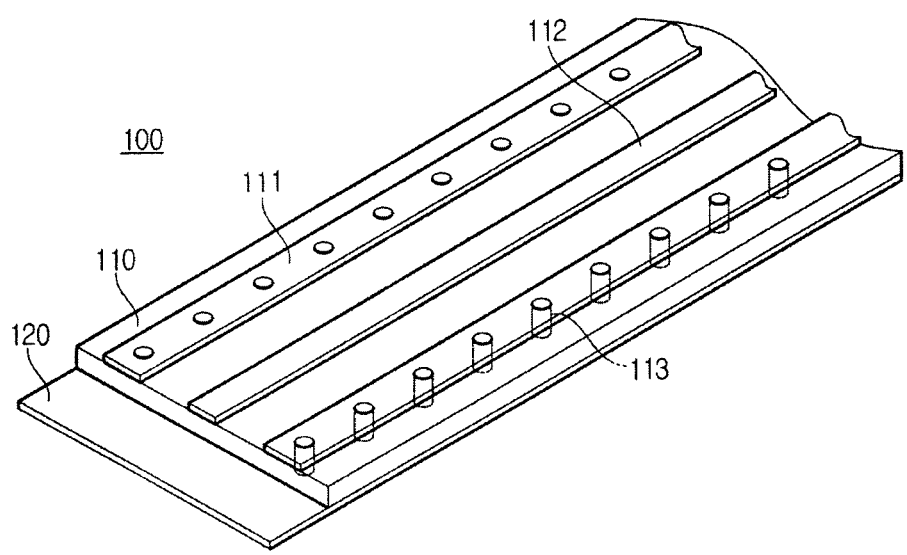

FIGS. 1A and 1B are conceptual diagrams illustrating a conventional art related to the present disclosure.

A design method (i.e., 20H-Rule) for absorbing electromagnetic waves (i.e., a radio frequency (RF) signal) using a printed circuit board (PCB) 100 will hereinafter be described with reference to FIG. 1A.

FIG. 1A(a) is a schematic view illustrating the PCB 100 to which 20H-Rule is not applied. In this case, the PCB 100 of FIG. 1A(a) may include a power plane 110 located at an upper part and a ground plane 120 located at a lower part.

Referring to FIG. 1A, the power plane 110 may provide a power-supply voltage to electronic components populated on the PCB. In this case, the power plane 110 may emit RF signals (i.e., electromagnetic waves). The RF signals may be absorbed in the ground plane 120. However, assuming that the PCB 100 is designed as shown in FIG. 1A(a), the RF signals may be emitted outside due to RF characteristics.

FIG. 1A(b) illustrates the PCB 100 in which the ground plane 120 is designed to be longer than the power plane 110 so as to shield emitted RF signals. In this case, 20H-Rule is applied to the PCB 100. In more detail, according to the 20H-Rule design method, assuming that a distance between the power plane 110 and a contiguous plane (e.g., ground plane) is denoted by H, the ground plane 120 is designed to be longer than the power plane 110 20 times, i.e., the ground plane 120 is spaced apart from the power plane 110 by a predetermined gap corresponding to 20H.

The PCB 100 to which 20H-Rule is applied may absorb RF signals emitted from the power plane 110 as shown in FIG. 1A(b), and may suppress RF signals from being emitted to the outside of the PCB 100.

FIG. 1B is a view illustrating Ground Via Fence structure for shielding RF signals.

Referring to FIG. 1B, the PCB 100 for shielding RF signals may include a via fence 111, a microstrip line 112, and a via hole 113.

Generally, the PCB 100 may be designed in the form of a microstrip structure when a high frequency is equal to or higher than 900 MHz.

In more detail, when the frequency is gradually increased, AC (alternating current) energy is focused between a signal line and a ground, resulting in formation of a field. In order to control the field, the ground plane 120 of the PCB 100 must be coated with metal, the height of an intermediate dielectric material of the power plane 110 and the dielectric constant (permittivity) of the power plane 110 must be definitely defined. In addition, the signal line (i.e., the microstrip line 112) of the PCB 100 may be designed on the basis of the defined height and dielectric constant of the power plane 110.

The via fence 111 may be called a picket fence, and may improve independency between electronic components populated on the PCB 100. That is, the via fence 111 may protect electronic components from electric field (E-Field) interference.

The via hole 113 may interconnect respective conductors of the PCB 100, and a plurality of via holes 113 may be designed as shown in FIG. 1B. The via hole 113 may be electroplated for electrical connection, or a small rivet may be inserted into the via hole 113.

The PCB 100 shown in FIGS. 1A and 1B is well known, as a technology for shielding RF signals (electromagnetic waves), to those skilled in the art. However, the 20H-Rule of FIG. 1A has a low degree of freedom in design due to an unbalanced structure of the ground plane 120. In addition, due to a fence configured to block the emitted field, reflection occurs in the PCB 100 to which the Ground Via Fence structure of FIG. 1B is applied, and such reflected waves may unavoidably affect the signal line.

Figure 2:
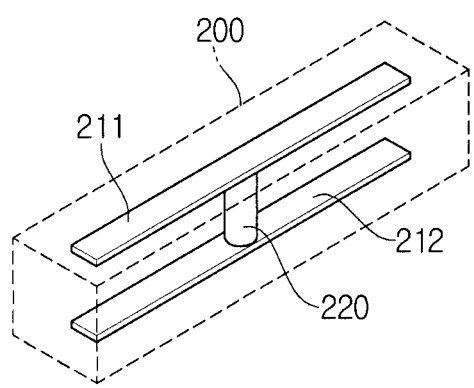
FIG. 2 is a perspective view illustrating a unit cell according to an embodiment of the present disclosure.

FIG. 2 is a perspective view illustrating a unit cell according to an embodiment of the present disclosure.

In accordance with one embodiment of the present disclosure, a unit cell may be provided at the outer wall of the PCB 100.

In more detail, the unit cell may be composed of a dielectric substrate 200, conductors 211 and 212 and a connection portion 220 for interconnecting the conductors 211 and 212 may be designed in an H-shape in the dielectric substrate 200.

One pair of conductors 211 and 212 may be provided, and may include the first conductor 211 connected to one end of the connection portion 220 and the second conductor 212 connected to the other end of the connection portion 220. Therefore, the first conductor 211 may be spaced apart from the second conductor 212 by a predetermined distance.

In the meantime, the connection portion 220 may be formed in a cylindrical shape, and may connect the first conductor 211 to the second conductor 212. Here, the connection portion 220 is not limited to the cylindrical shape, and may be defined in various shapes, for example, a rectangular parallelepiped, a trapezoid, a hexahedron, etc.

The connection portion 220 may be provided at the intermediate portion of the first conductor 211 and the second conductor 212, instead of at both ends of the first conductor 211 and the second conductor 212. That is, the connection portion 220 may interconnect one pair of the conductors 211 and 212, and may allow the conductors 211 and 212 to be constructed in an H-shape.

In this case, one pair of conductors 211 and 212 may serve as two capacitors C, and the connection portion 220 may serve as an inductor L, and as such a detailed description thereof will hereinafter be described with reference to FIGS. 5 and 6.

The conductors 211 and 211 may be manufactured as a square shape having a predetermined width to serve as the capacitor C. One pair of conductors 211 and 212 and the connection portion 220 may be formed of metal.

Figure 3:
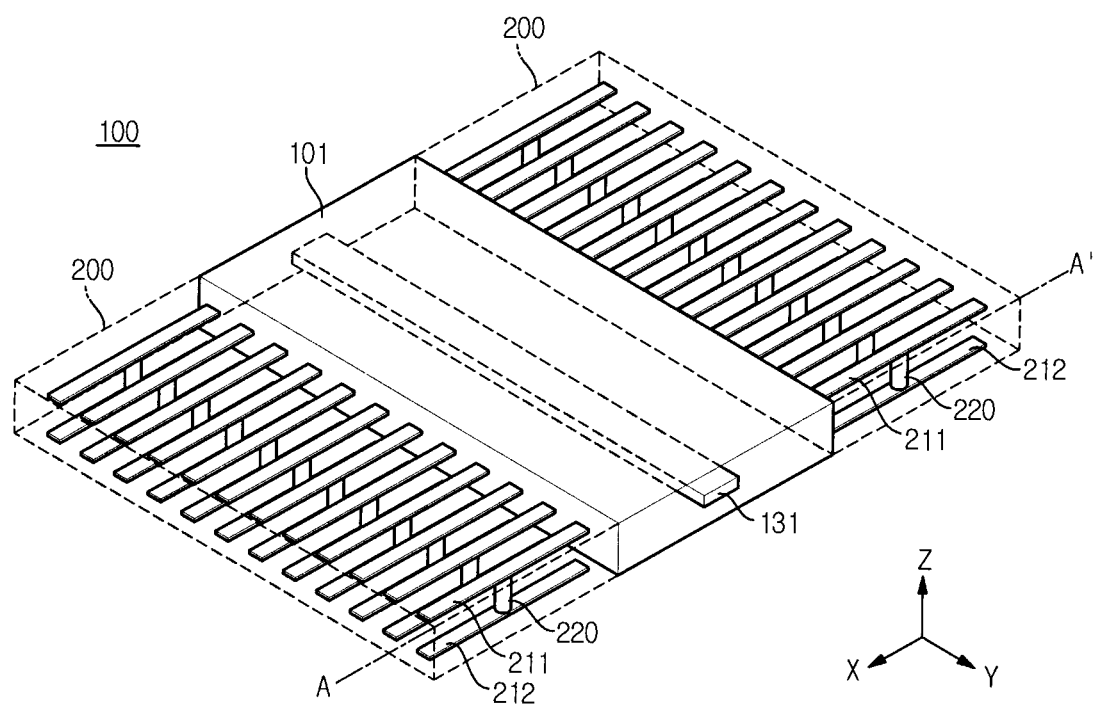
FIG. 3 is a perspective view illustrating a printed circuit board (PCB) in which unit cells are periodically arranged according to an embodiment of the present disclosure.
Figure 4:
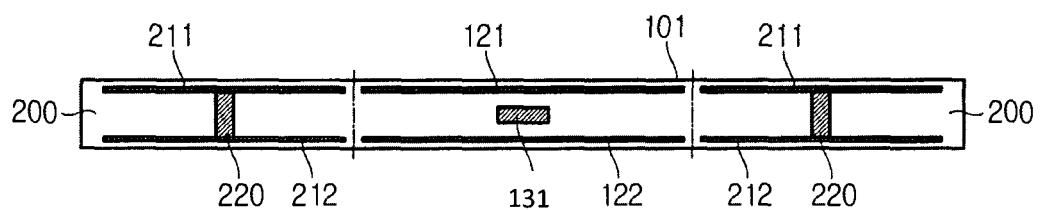
FIG. 4 is a cross-sectional view illustrating the printed circuit board (PCB) taken along the line A-A' shown in FIG. 3.

FIG. 3 is a perspective view illustrating a printed circuit board (PCB) in which unit cells are periodically arranged according to an embodiment of the present disclosure, and FIG. 4 is a cross-sectional view illustrating the printed circuit board (PCB) taken along the line A-A' shown in FIG. 3.

Referring to FIG. 3, the PCB 100 may include a substrate 101 on which electronic components are populated, and unit cells shown in FIG. 2 are periodically arranged at both sides of the substrate 101.

In more detail, the substrate 101 may include electronic components, and may further include a signal line 131. That is, the substrate 101 may refer to a printed circuit board (PCB) well known to those skilled in the art.

As illustrated in FIGS. 1A and 1B, 20H-Rule may be applied to the conventional PCB 100 so as to shield RF signals generated from a high-frequency region.

However, according to the PCB 100 of FIG. 3, unit cells shown in FIG. 2 are periodically arranged in an X-axis direction of the substrate 101 including electronic components, such that RF signals can be effectively shielded.

In more detail, the dielectric substrate 200 may be bonded to the PCB 100 in a thickness direction of the substrate 101 (i.e., in both directions of an X-axis).

In this case, the dielectric substrate 200 may serve as a cavity to cause structural resonance. That is, the electric substrate 200 may be filled with a material having a predetermined dielectric constant (permittivity), and may serve as a medium of RF signals emitted from the substrate 101. For example, the dielectric substrate 200 may be manufactured using an FR4 epoxy substrate.

RF signals emitted from the substrate 101 may be shielded by the split resonator through the dielectric substrate 200. As illustrated in FIG. 2, the split resonator may be connected to the connection portion 220 and one end of the connection portion 220, such that the first conductor 211 and the second conductor 212 connected to the other end of the connection portion 220 may be manufactured in an H-shape. In more detail, the connection portion 220 may be arranged in parallel to a thickness direction of the substrate 101 (i.e., a Z-axis direction of the substrate 101).

The first conductor 211 and the second conductor 212 may be arranged in parallel to the width of the substrate 101 (i.e., an X-axis direction of the substrate 101). In addition, the conductors 211 and 212 may be spaced apart from the substrate 101 by a predetermined distance.

In the meantime, as shown in FIG. 3, a plurality of split resonators mounted to the dielectric substrate 200 may be spaced apart from each other by a predetermined distance in a Y-axis direction of the substrate 101.

In addition, the dielectric substrates 200 may be arranged in an X-axis direction to be symmetrical to each other on the basis of the PCB 100, and each of two dielectric substrates 200 may include periodically arranged split resonators.

FIG. 4 is a cross-sectional view illustrating the printed circuit board (PCB) 100 taken along the line A-A' of FIG. 3. Referring to FIG. 4, the substrate 101 of the CPB 100 according to the embodiment of the present disclosure may include a first ground plane 121 grounded to a top surface, a signal line 131 contained in the substrate, and a second ground plane 122 grounded to a bottom surface.

The first ground plane 121 may shield RF signals from being emitted to the top surface of the substrate 101, and the second ground plane 122 may shield RF signals from being emitted to the bottom surface of the substrate 101. The signal line 131 may allow electronic components to receive power.

Meanwhile, the ground planes 121 and 122 and the signal line 131 contained in the substrate 101 are merely examples of the present disclosure, and may be changed in various ways according to usages of the PCB 100.

The split resonators shown in FIG. 3 may be located at both sides of the substrate 101 of FIG. 4 while being spaced apart from each other by a predetermined distance, and each split resonator may include one pair of conductors 211 and 212 and the connection portion 220. The split resonator may be constructed in a laid H-shape as shown in FIG. 4.

The operation for shielding RF signals using the split resonator will hereinafter be described with reference to the attached drawings.

Figure 5:
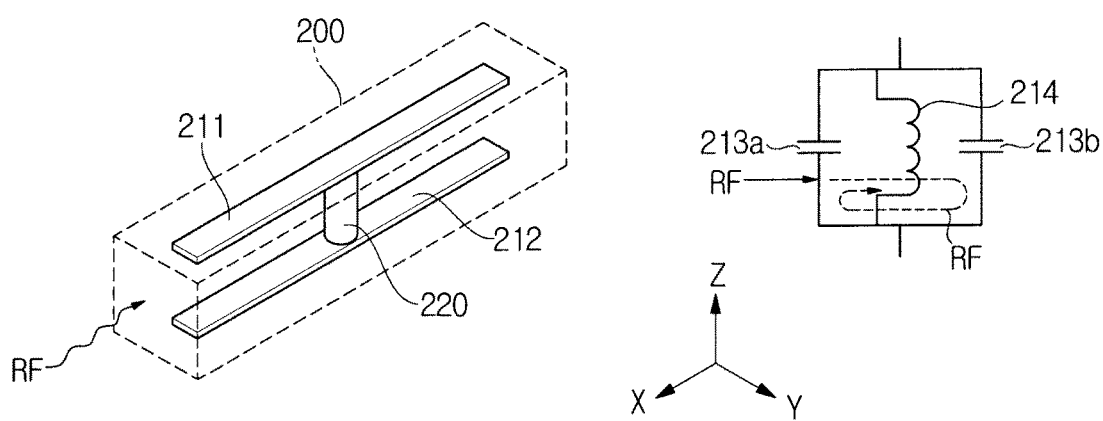
FIG. 5 and FIG. 6 are conceptual diagrams illustrating the operation of the PCB according to an embodiment of the present disclosure.
Figure 6:
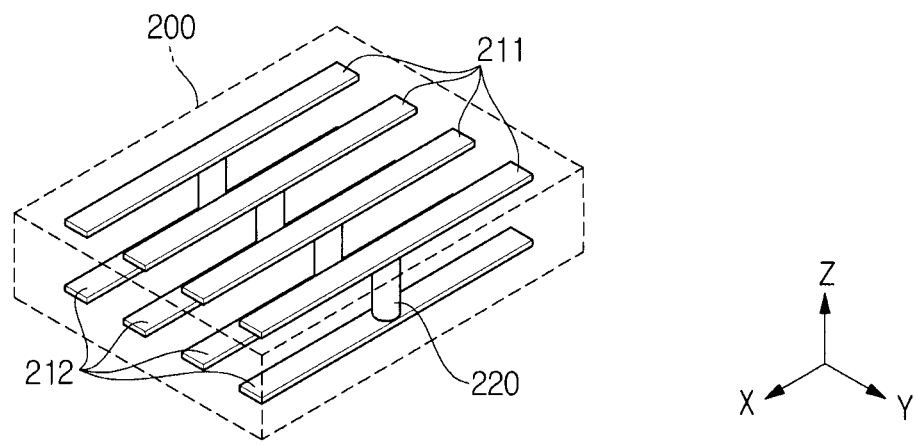
Figure 6:
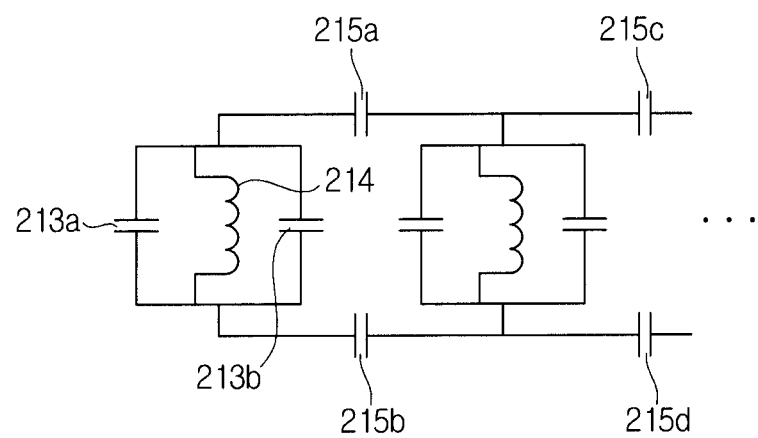

FIGS. 5 and 6 are conceptual diagrams illustrating the operation of the PCB according to an embodiment of the present disclosure.

The first conductor 211 and the second conductor 212 of the above-mentioned split resonator may operate as a capacitor C. In addition, the connection portion 220 of the split resonator may operate as inductance L.

Therefore, a unit cell of the split resonator may be represented by a circuit diagram of FIG. 5. That is, the unit cell may operate as a circuit in which two capacitors 213a, 213b and one inductor 214 are coupled in parallel to each other.

The operation in that RF signals are incident in the X-axis direction of the unit cell may be identical to the operation in that RF signals are incident into the first capacitor 213a of the circuit. The incident RF signals may be absorbed in a gap (i.e., a dielectric space) between the first capacitor 213a and the second capacitor 213b of the split resonator.

Therefore, the split resonator may increase a medium loss component of permittivity (dielectric constant) and permeability in a manner that the PCB 10 has a negative(−) refractive index, and the split resonator may operate as a structure capable of absorbing RF signals.

Capacitance and inductance for deciding permittivity and permeability may be determined to be a structural size between the connection portion 220 and one pair of conductors 211 and 212 of the split resonator. That is, the structural size of one pair of conductors 211 and 212 and the connection portion 220 may be determined according to RF signals having a specific frequency to be absorbed by the PCB 100, and the capacitance and inductance values of the circuit may be determined.

FIG. 6 is a circuit diagram illustrating the split resonator in which unit cells of FIG. 5 are periodically arranged.

Referring to FIG. 6, one pair of conductors 211 and 212 and the connection portion 220 may be successively arranged in the dielectric substrate 200 while being spaced apart from each other by a predetermined distance.

Referring to FIG. 5, the conductors 211 and 212 may be arranged in parallel to each other by the connection portion 220, and may respectively operate as capacitors 213a and 213b by a constant distance therebetween.

Referring to FIG. 6, assuming that unit cells spaced apart from each other by a constant distance are periodically arranged on the dielectric substrate 200, a plurality of conductors (e.g., a plurality of first conductors 211) may operate as capacitors 215a and 215c. In addition, assuming that the second conductors 212 of the unit cells are spaced apart from each other, the second conductors 212 may operate as the capacitors 215b and 215d. The capacitors 215a, 215b, 215c, and 215d may shield RF signals emitted in the Z-axis direction of the split resonator.

Figure 7:
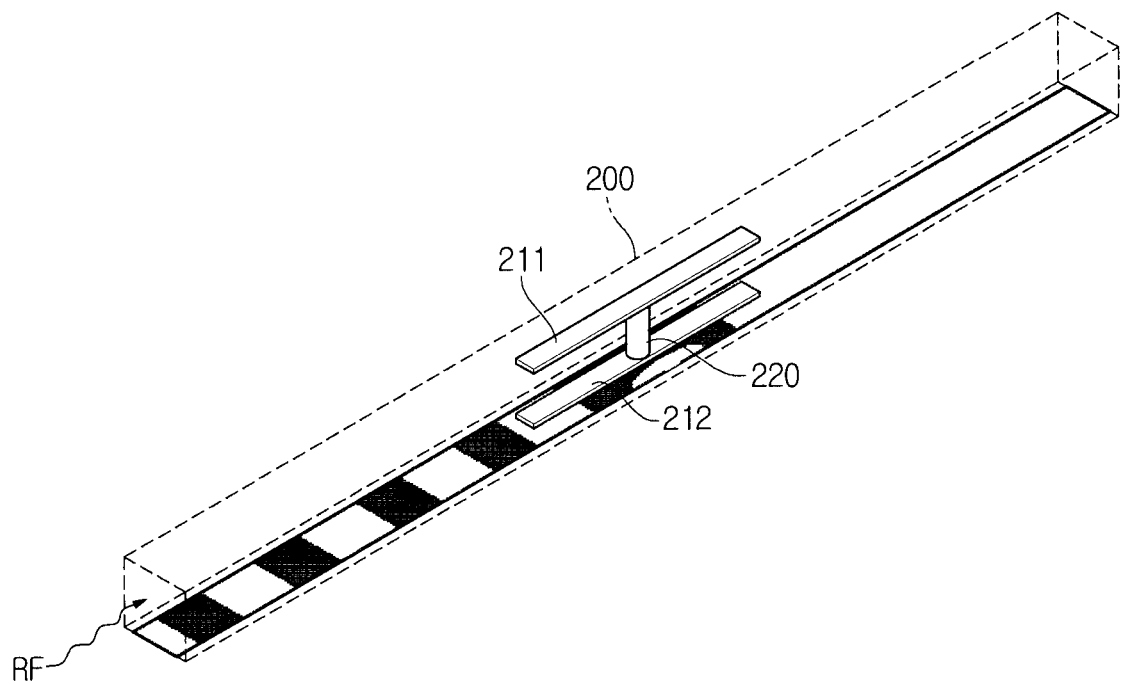
FIG. 7 is a conceptual diagram illustrating E-field cutoff characteristics of a unit cell of the PCB according to an embodiment of the present disclosure.

FIG. 7 is a conceptual diagram illustrating E-field cutoff characteristics of a unit cell of the PCB according to an embodiment of the present disclosure.

The unit cell may shield RF signals as shown in FIG. 5. That is, RF signals having passed through the split resonator may be confined in the split resonator. The above-mentioned operation can be represented by E-field cutoff characteristics, as shown in FIG. 7.

In more detail, assuming that RF signals are incident in the direction of FIG. 7, the electric field (E-field) caused by RF signals can be represented by FIG. 7. That is, the split resonator may block the E-field until reaching a specific point corresponding to the second capacitor 213b, and may shield RF signals from being emitted to the outside of the PCB 100.

In the meantime, the split resonator according to the embodiment may shield not only the E-field but also a magnetic field, and magnetic field cutoff characteristics may be similar in shape to FIG. 7.

Figure 8A:
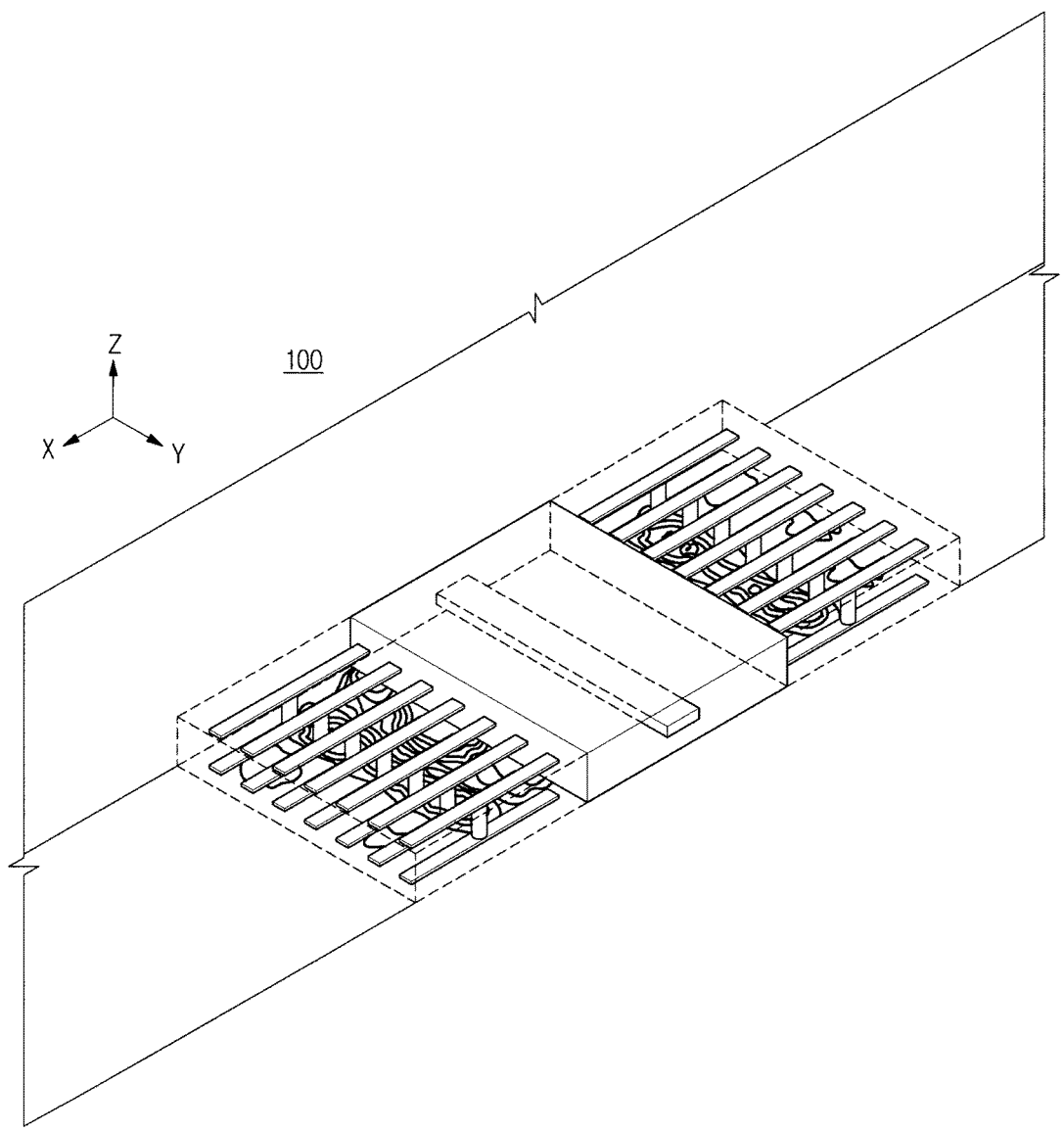
FIG. 8A and FIG. 8B are conceptual diagrams illustrating cutoff characteristics of the PCB according to an embodiment of the present disclosure.
Figure 8B:
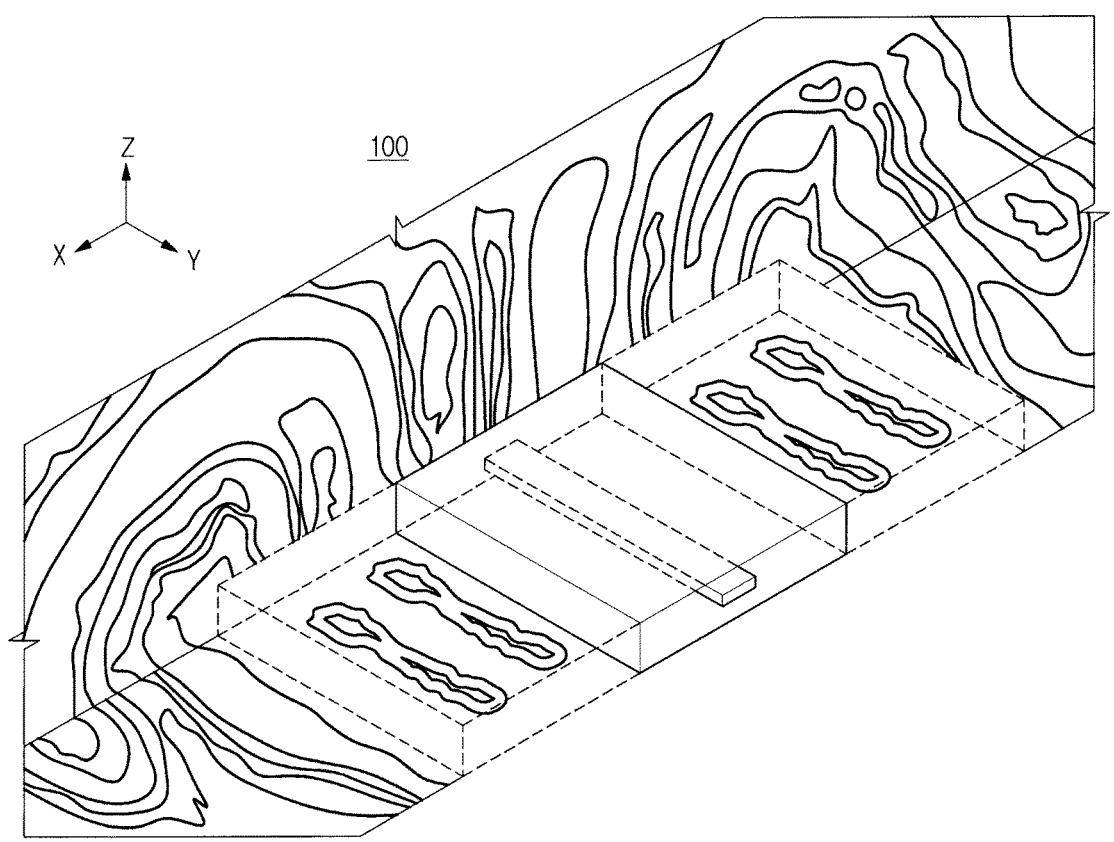

FIGS. 8A and 8B are conceptual diagrams illustrating cutoff characteristics of the PCB according to an embodiment of the present disclosure.

In more detail, as shown in FIG. 8A, the PCB 100 including the split resonator and an electromagnetic field are located at a bottom surface of the substrate 100. FIG. 8B is a view illustrating the PCB 100 to which the split resonator is not applied.

The PCB 100 according to the embodiment may be constructed in a manner that the split resonators are periodically arranged at one side of the substrate 101. As illustrated in FIG. 6, unit cells of the split resonators spaced apart from each other by a predetermined distance may prevent RF signals from being emitted in the Z-axis direction.

Therefore, as shown in FIG. 8A, the E-field is rarely formed in the Z-axis direction of the PCB 100. In comparison with the PCB of FIG. 8A, the electromagnetic field is formed not only in the X-axis direction but also in the Z-axis direction in the PCB 100 of FIG. 8B to which the split resonator is not applied.

Figure 9A:
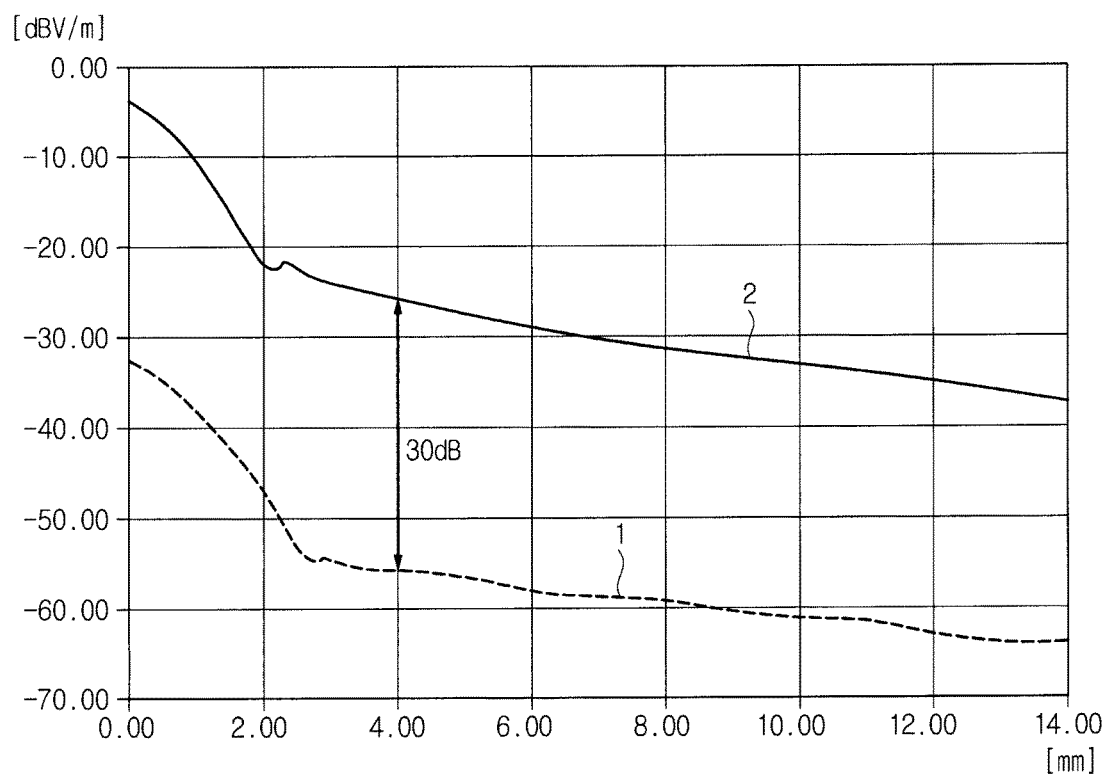
FIG. 9A and FIG. 9B are graphs illustrating the PCB effect according to an embodiment of the present disclosure.
Figure 9B:
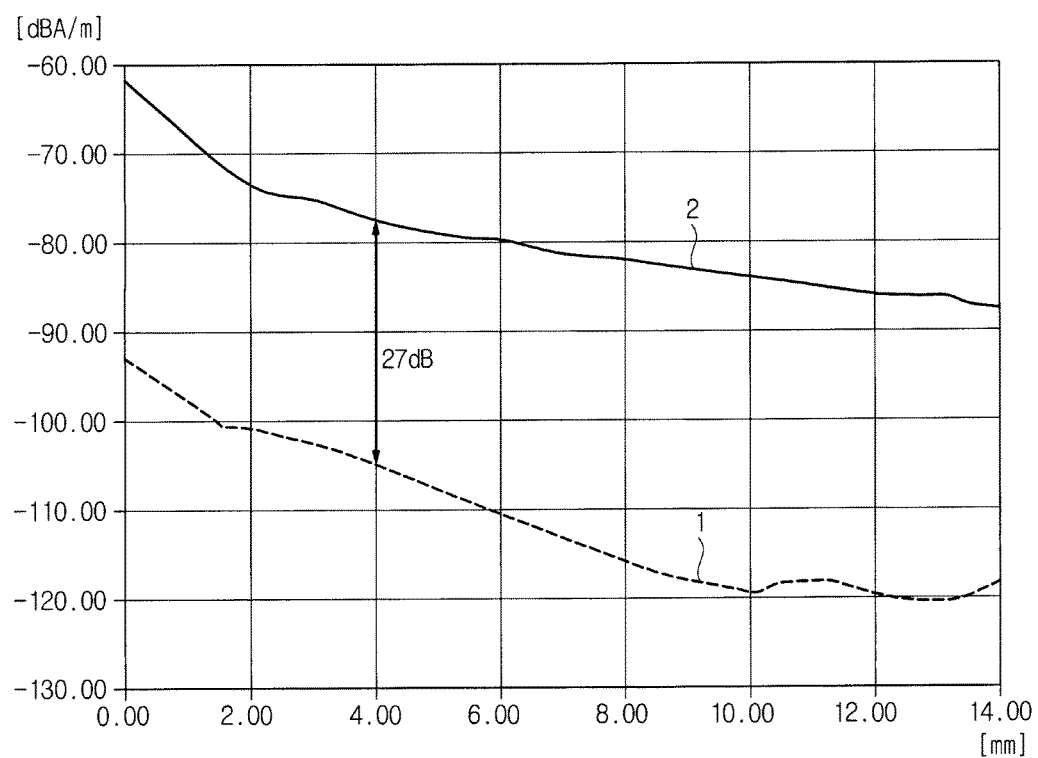

FIGS. 9A and 9B are graphs illustrating the PCB effect according to an embodiment of the present disclosure. FIG. 9A is a graph illustrating an electric field (E-Field), and FIG. 9B is a graph illustrating a magnetic field.

In more detail, as shown in FIGS. 9A and 9B, the RF signal emitted from the edge of the PCB 100 based on an inner layer wiring may be classified into E-field intensity and magnetic field intensity.

Referring to FIGS. 9A and 9B, a first line (1 line) may refer to the PCB 100 to which the split resonator is applied, and a second line (2 line) may refer to a general PCB to which the split resonator is not applied.

In the graphs of FIGS. 9A and 9B, an X-axis may refer to a distance (mm) spaced apart from the substrate on the basis of the edge of the substrate 101 including electronic components in the PCB 100, and a Y-axis may refer to the magnitude (dB V/m) of electric field measured in the air or the magnitude (dB A/m) of magnetic field measured in the air.

The connection portion 220 of the split resonator may be located between 2 mn and 3 mn on the basis of the edge of the substrate 101.

In comparison with the electric field (E field) measured in FIG. 8A, it can be confirmed that the electric field (E field) is reduced by 30 dB at a specific position at which the PCB 100 is spaced apart from the other PCB to which the split resonator is not applied by the distance of 4 mn.

In comparison with the magnetic field (H field) measured in FIG. 8B, it can be confirmed that the magnetic field (H field) is reduced by 27 dB at a specific position at which the PCB 100 is spaced apart from the other PCB to which the split resonator is not applied by the distance of 4 mn.

That is, the PCB 100 can effectively shield RF signals emitted to one side of the PCB 100 using the split resonator.

Figure 10A:
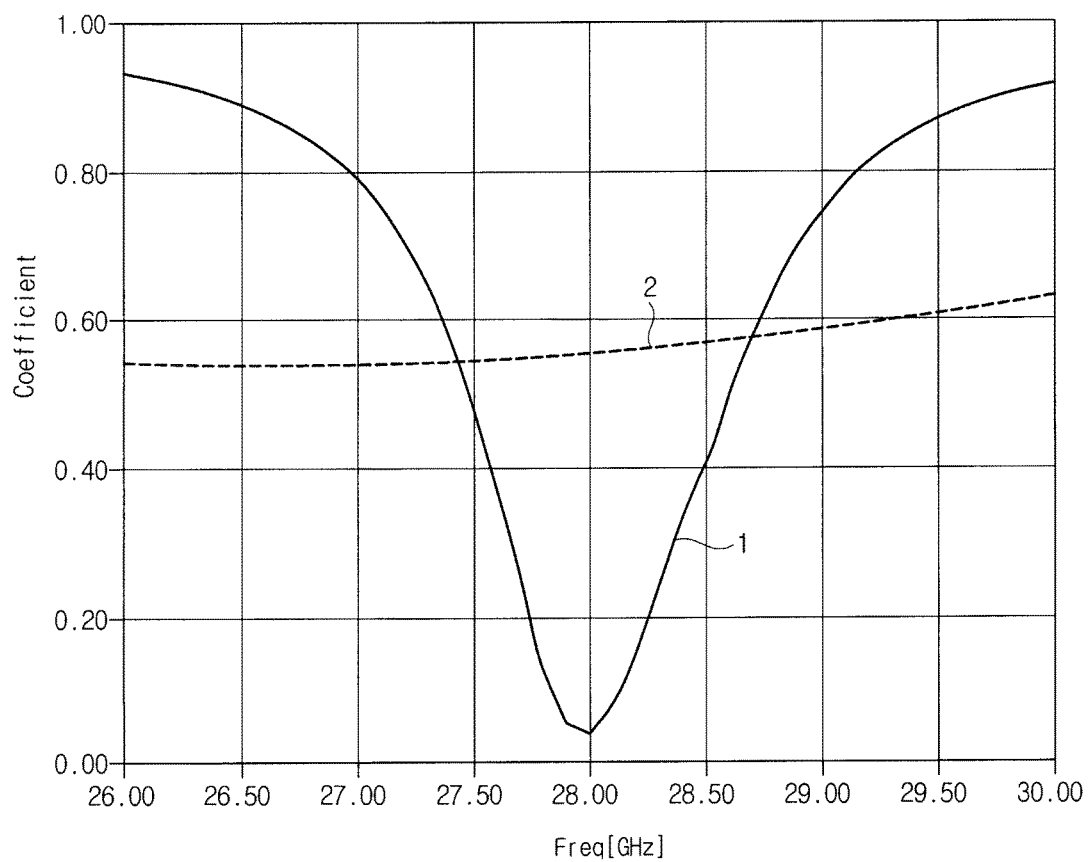
FIG. 10A, FIG. 10B and FIG. 10C are graphs illustrating the effect for shielding a specific frequency using the PCB according to an embodiment of the present disclosure.
Figure 10B:
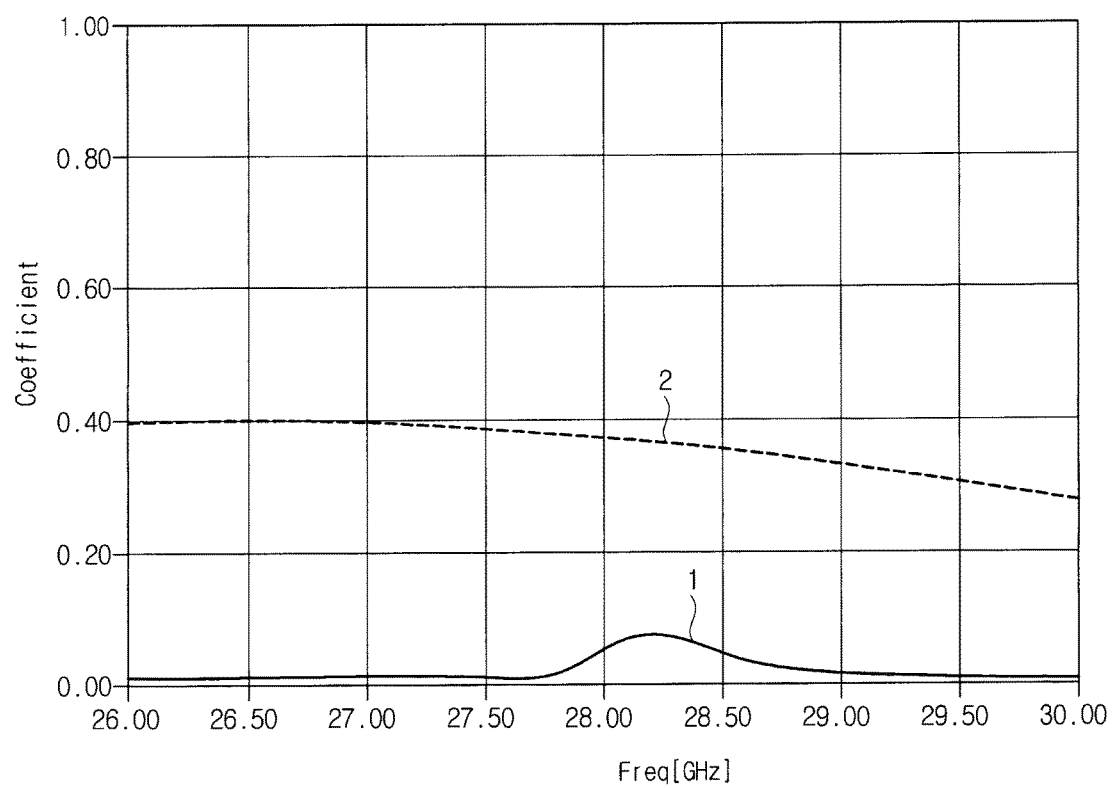
Figure 10C:
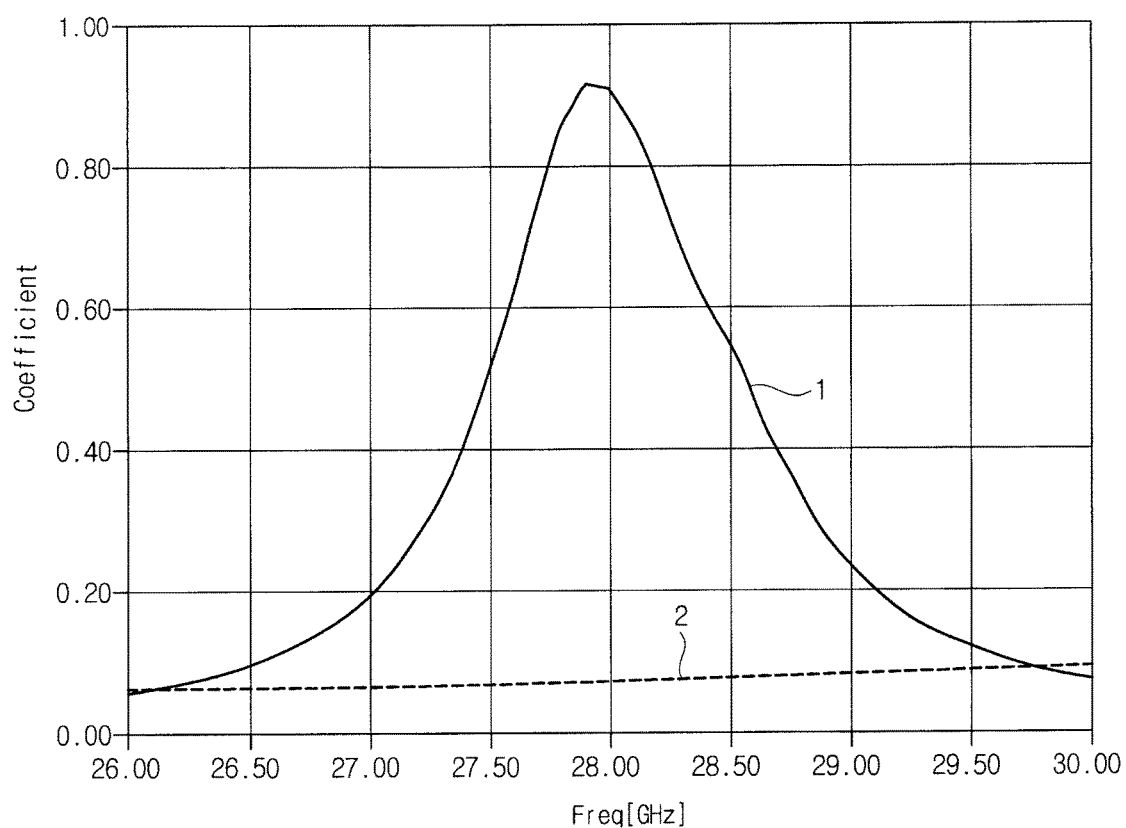

FIGS. 10A to 10C are graphs illustrating the effect for shielding a specific frequency using the PCB according to an embodiment of the present disclosure.

In the graphs of FIGS. 10A to 10C, an X-axis may refer to a specific frequency band, and a Y-axis may refer to a coefficient. In each graph, a first line (1 line) may refer to characteristics of the PCB 100, and a second line (2 line) may refer to characteristics of the conventional PCB.

According to the split resonator of the embodiment, a specific frequency of RF signals capable of being shielded by a structural size of the conductor and the connection portion may be specified.

Therefore, the PCB 100 is superior to the conventional PCB in terms of noise transmission characteristics, reflection characteristics, and absorption characteristics at a specific frequency.

Referring to FIG. 10A, the PCB 100 is superior to the conventional PCB in terms of noise transmission characteristics at a frequency of 28 GHz. That is, the PCB 100 can shield RF signals having a 28 GHz frequency band from being emitted to the outside.

Referring to FIG. 10B, the PCB 100 is superior to the conventional PCB in terms of noise reflection characteristics in the vicinity of a frequency range from 28.1 GHz to 28.5 GHz. That is, although the conventional PCB 100 does not discriminate a specific frequency band, the PCB 100 can effectively shield RF signals by increasing reflection characteristics of a specific frequency band.

Referring to FIG. 10C, the PCB 100 is superior to the conventional PCB in terms of noise absorption characteristics at a frequency of 28 GHz. That is, the PCB 100 does not emit RF signals having the 28 GHz frequency band to the outside, and can effectively shield the RF signals.

Figure 11:
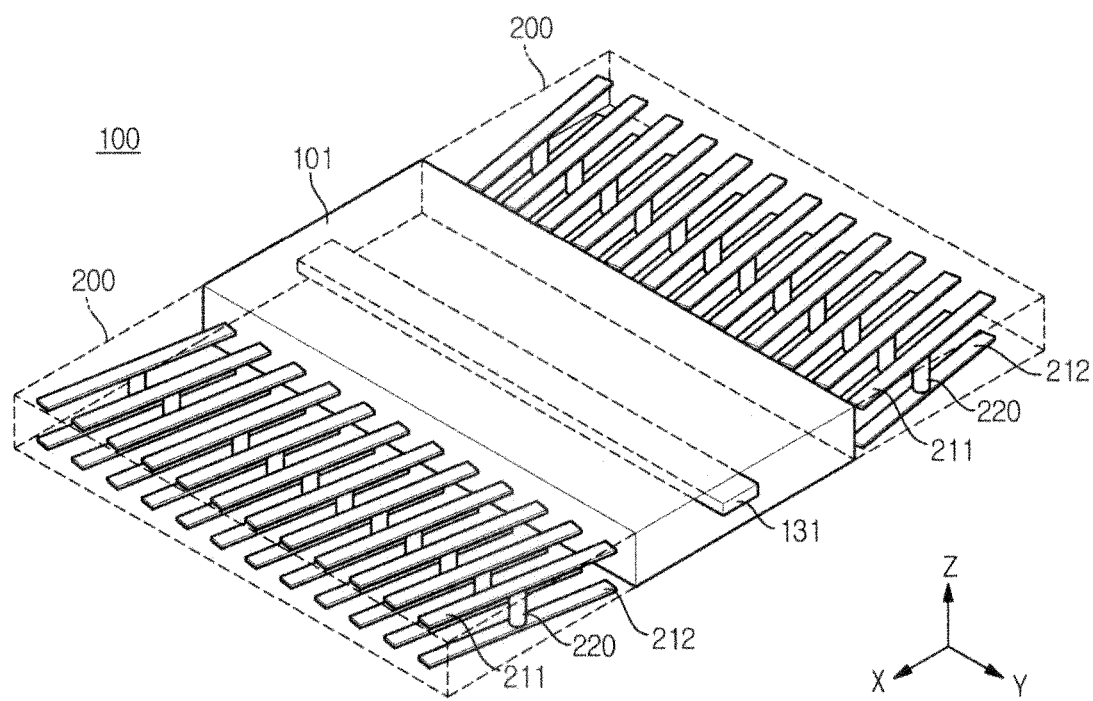
FIG. 11 is a perspective view illustrating a printed circuit board (PCB) according to another embodiment of the present disclosure.

FIG. 11 is a perspective view illustrating a printed circuit board (PCB) according to another embodiment of the present disclosure.

Referring to FIG. 11, the split resonators of the PCB 100 are not always arranged in the form of FIG. 3. That is, the conductors 211, 212 of the split resonator may not be parallel to the width (i.e., the X-axis direction) of the substrate 101 including electronic components, and may be tilted at a specific angle as shown in FIG. 11.

In the above-mentioned embodiment, the dielectric substrate 200 may be formed of an FR4 epoxy substrate, and the connection portion 220 and the conductors 211, 212 may be formed of metal.

In the meantime, as shown in FIG. 11, the specific angle of arrangement of the split resonator may be used in various ways according to a specific frequency to be shielded by the PCB 100, and may be modified in various ways as necessary.

Figure 12:
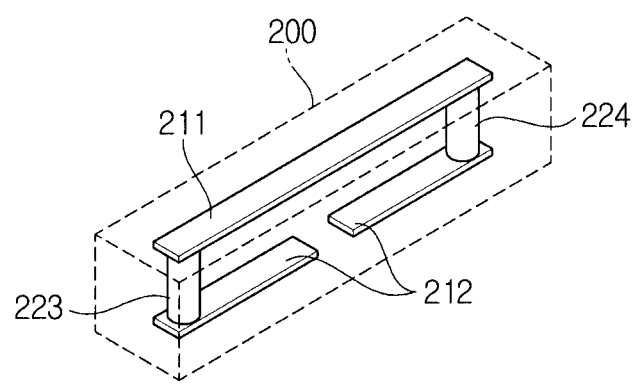
FIG. 12 is a view illustrating another embodiment of the present disclosure.
Figure 13:
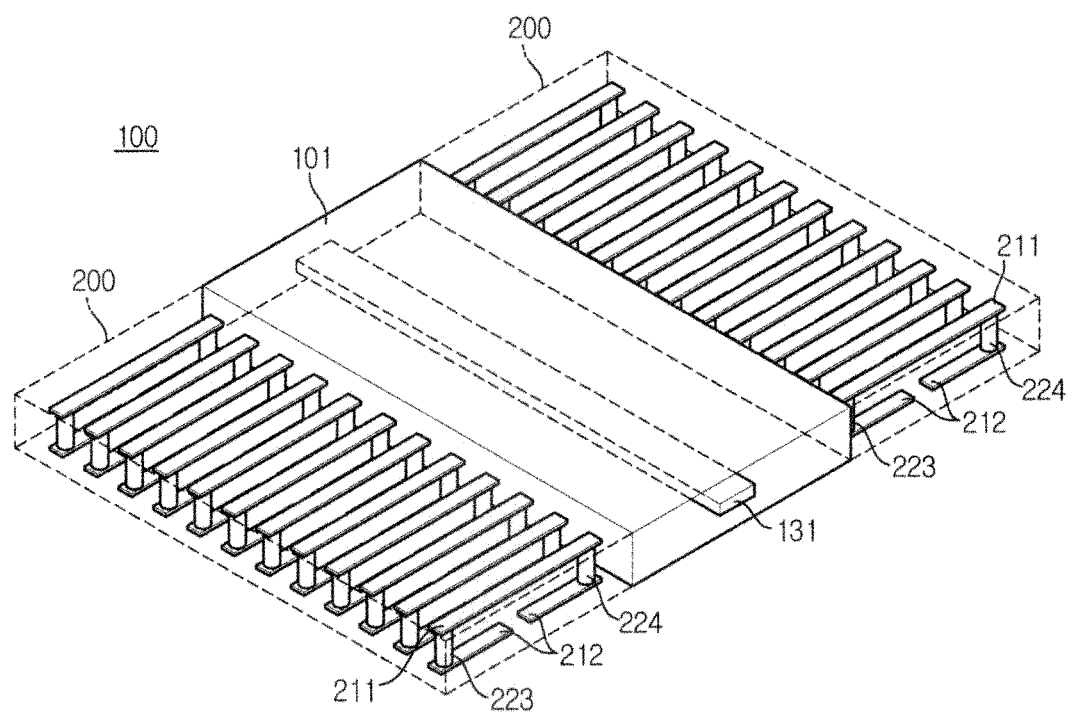
FIG. 13 is a perspective view illustrating the PCB according to the embodiment to which the example of FIG. 12 is applied.

FIG. 12 is a view illustrating another embodiment of the present disclosure, and FIG. 13 is a perspective view illustrating the PCB according to the embodiment to which the example of FIG. 12 is applied.

Referring to FIG. 12, the unit cell of the PCB 100 may include a plurality of connection portions 220. In comparison with FIG. 2, the split resonator according to another embodiment may be manufactured by connecting one pair of conductors 211 and 212 to the plurality of connection portions 223 and 224.

However, as shown in FIG. 1, one conductor 212 from among the conductors 211 and 212 contained in the split resonator according to one embodiment may be severed. In comparison with FIG. 2, the intermediate connection portion 220 for interconnecting the conductors 211 and 212 may be omitted.

The split resonator may operate as a resonator circuit including a plurality of capacitors C and an inductor L, and may shield RF signals without emitting RF signals to the outer wall as shown in FIG. 5.

In the meantime, the connection portions 223 and 224 of the split resonator may be formed in a cylindrical shape as shown in FIG. 12. However, the shapes of the connection portions 223 and 224 are not limited thereto, and may include a rectangular parallelepiped or other shapes.

Referring to FIG. 13, the PCB 100 may be manufactured by periodically arranging unit cells of FIG. 12 at one side or both sides of the substrate 101, and the PCB 100 can effectively absorb the electric field (E field) or the magnetic field (H field).

In the meantime, the size of the plurality of connection portions 221 and 222 and the size of one pair of conductors 211 and 212 contained in the PCB 100 according to another embodiment may be established in various ways on the basis of a specific frequency to be shielded, and may not be limited thereto.

Figure 14:
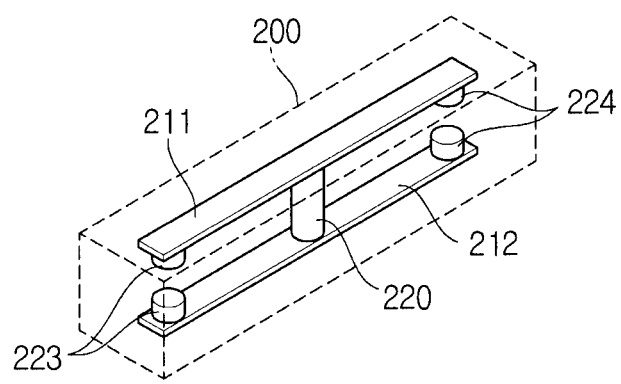
FIG. 14 is a view illustrating another embodiment of the present disclosure.
Figure 15:
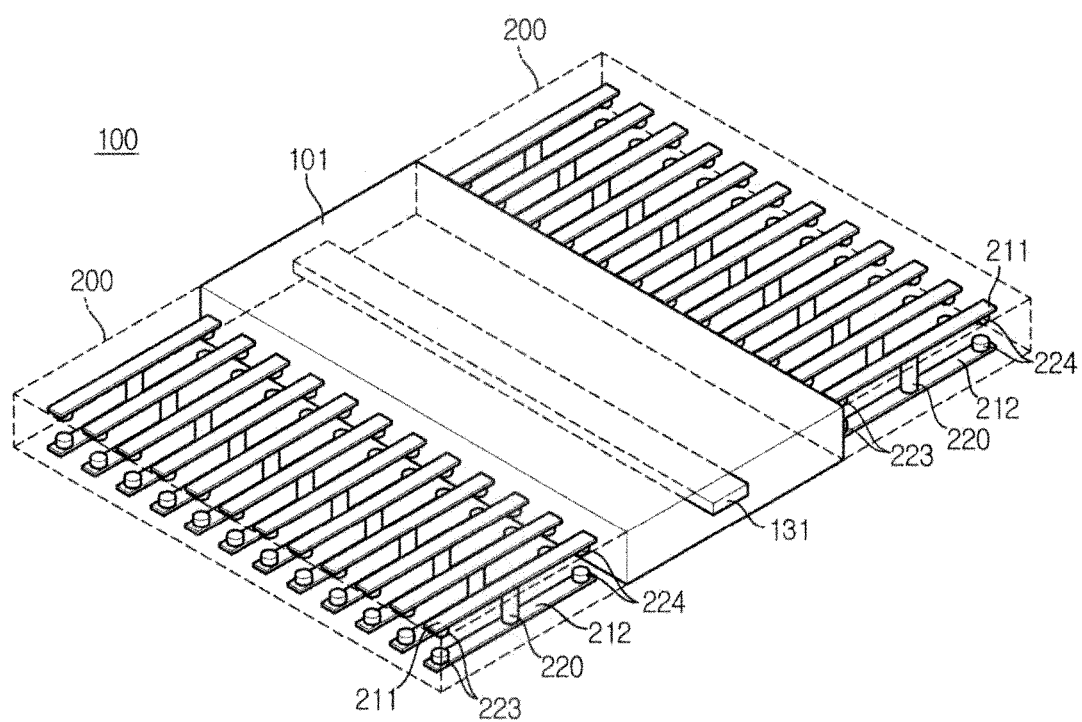
FIG. 15 is a perspective view illustrating the PCB according to the embodiment to which the example of FIG. 14 is applied.

FIG. 14 is a view illustrating another embodiment of the present disclosure, and FIG. 15 is a perspective view illustrating the PCB according to the embodiment to which the example of FIG. 14 is applied.

Referring to FIG. 14, the split resonator may include one pair of conductors 211 and 212, the connection portion 220 for interconnecting the conductors 211 and 212, and a plurality of connection portions 223 and 224 respectively mounted to both sides of one pair of the conductors.

In comparison with the plurality of connection portions 223 and 224 shown in FIG. 14, the intermediate portion of the plurality of connection portions 223 and 224 of FIG. 14 may be severed. That is, the conductors 211 and 222 of the split resonator may be manufactured in a flat rectangular parallelepiped shape as shown in FIGS. 2 and 12, and both ends of FIG. 14 may protrude toward the facing conductor.

In this case, the split resonator may operate as the resonator circuit including the plurality of capacitors C and the inductor L, and may shield RF signals.

Meanwhile, the plurality of severed connection portions 223 and 225 may be constructed in a cylindrical shape as shown in FIG. 14, may be modified in various shapes, and may not be limited thereto.

Referring to FIG. 15, the PCB 100 may be manufactured in a manner that unit cells of FIG. 14 are periodically arranged at one side or both sides of the substrate 101, and may effectively absorb the magnetic field (H field) or the electric field (E field).

Meanwhile, the physical size of the split resonator provided to the PCB 100 according to another embodiment may be established in various ways on the basis of a specific frequency to be shielded, and may not be limited thereto.

As is apparent from the above description, the embodiments of the present disclosure can improve the electromagnetic shielding effect by improving a split resonator mounted to the PCB.

The embodiments of the present disclosure can absorb a radiation field emitted to the outer wall of the PCB.

The electronic device including the PCB can prevent malfunction of the electronic device by suppressing mutual interference caused by high frequency.

Although a few embodiments of the present disclosure have been shown and described, it would be appreciated by those skilled in the art that changes may be made in these embodiments without departing from the principles and spirit of the invention, the scope of which is defined in the claims and their equivalents.

What is claimed is:

1. A printed circuit board (PCB) comprising:
    a substrate on which one or more electronic components are populated;
    a dielectric substrate mounted to one side of the substrate;
    one pair of conductors provided in the dielectric substrate, spaced apart from the substrate in a thickness direction of the substrate by a predetermined distance, and arranged to face each other, and
    a connection portion provided in the dielectric substrate, and configured to interconnect the one pair of conductors, and arranged in parallel to the thickness direction of the substrate,
    wherein the one pair of conductors comprises a first conductor and a second conductor, and a length of the first conductor is longer than a distance between the connecting portion and one end of the second conductor, and a length of the second conductor is longer than a distance between the connecting portion and one end of the first conductor.

2. The printed circuit board (PCB) according to claim 1, wherein the connection portion includes a plurality of connection portions configured to interconnect the one pair of conductors.

3. The printed circuit board (PCB) according to claim 1, wherein the one pair of conductors is arranged at a predetermined angle with respect to the thickness direction.

4. The printed circuit board (PCB) according to claim 1, wherein the one pair of conductors, the connection portion, and the dielectric substrate are arranged to be symmetrical to each other with respect to an axis in the thickness direction.

5. The printed circuit board (PCB) according to claim 1, wherein the dielectric substrate includes FR4.

6. The printed circuit board (PCB) according to claim 1, wherein the one pair of conductors has a capacitance, said capacitance based on a predetermined width of the one pair of conductors.

7. The printed circuit board (PCB) according to claim 1, wherein the connection portion has an inductance, said inductance based on a cylindrical shape of the connection portion.

8. The printed circuit board (PCB) according to claim 1, wherein the conductor and the connection portion are formed of metal.

9. The printed circuit board (PCB) according to claim 1, wherein the substrate includes:
    a first ground plane provided in the substrate;
    a signal line located below the first ground plane, and spaced apart from the first ground plane; and
    a second ground plane located below the signal line and spaced apart from the signal line.

10. A printed circuit board (PCB) comprising:
    a substrate on which one or more electronic components are populated;
    a dielectric substrate mounted to one side of the substrate; and
    one or more split resonators provided in the dielectric substrate, and periodically arranged in the dielectric substrate,
    wherein the split resonator includes:
    one pair of conductors provided in the dielectric substrate, spaced apart from the substrate in a thickness direction of the substrate by a predetermined distance, and arranged to face each other; and
    a connection portion provided in the dielectric substrate, and configured to interconnect the one pair of conductors, and arranged in parallel to the thickness direction of the substrate,
    wherein the one pair of conductors comprises a first conductor and a second conductor, and a length of the first conductor is longer than a distance between the connecting portion and one end of the second conductor, and a length of the second conductor is longer than a distance between the connecting portion and one end of the first conductor.

11. The printed circuit board (PCB) according to claim 10, wherein the connection portion includes a plurality of connection portions configured to interconnect the one pair of conductors.

12. The printed circuit board (PCB) according to claim 10, wherein the one pair of conductors is arranged at a predetermined angle with respect to the thickness direction.

13. The printed circuit board (PCB) according to claim 10, wherein the split resonators are symmetrical to each other with respect to an axis in the thickness direction.

14. The printed circuit board (PCB) according to claim 10, wherein the dielectric substrate includes an FR4 epoxy substrate.

15. The printed circuit board (PCB) according to claim 10, wherein the one pair of conductors has a capacitance, said capacitance based on a predetermined width of the one pair of conductors.

16. The printed circuit board (PCB) according to claim 10, wherein the connection portion has an inductance, said inductance based on a cylindrical shape of the connection portion.

17. The printed circuit board (PCB) according to claim 10, wherein the conductor and the connection portion are formed of metal.

18. The printed circuit board (PCB) according to claim 10, wherein the substrate includes:
    a first ground plane provided in the substrate;
    a signal line located below the first ground plane, and spaced apart from the first ground plane; and
    a second ground plane located below the signal line and spaced apart from the signal line.

19. A split resonator comprising:
    one pair of conductors provided in a dielectric substrate, spaced apart from a substrate in a thickness direction of the substrate by a predetermined distance, and arranged to face each other; and
    a connection portion provided in the dielectric substrate, and configured to interconnect the one pair of conductors, and arranged in parallel to the thickness direction of the substrate,
    wherein the one pair of conductors comprises a first conductor and a second conductor, and a length of the first conductor is longer than a distance between the connecting portion and one end of the second conductor, and a length of the second conductor is longer than a distance between the connecting portion and one end of the first conductor.

* * * * *